United States Patent

Yamamoto et al.

[11] Patent Number: 5,851,658
[45] Date of Patent: Dec. 22, 1998

[54] DIAMOND COATED ARTICLE AND PROCESS FOR PRODUCING THEREOF

[75] Inventors: Hiroshi Yamamoto; Takashi Okamura; Satoshi Iio, all of Aichi, Japan

[73] Assignee: NGK Spark Plug Co., Ltd., Nagoya, Japan

[21] Appl. No.: 675,905

[22] Filed: Jul. 5, 1996

[30] Foreign Application Priority Data

Jul. 5, 1995 [JP] Japan .................................. 7-194234
Jul. 4, 1996 [JP] Japan .................................. 8-195394

[51] Int. Cl.[6] .................................................. C23C 16/26
[52] U.S. Cl. .......................... 428/334; 428/216; 428/332; 428/408; 428/336; 51/295; 51/307; 51/309; 423/446
[58] Field of Search ..................... 428/408, 332, 428/336, 334, 216; 51/307, 309, 295; 423/446

[56] References Cited

U.S. PATENT DOCUMENTS

| | | | |
|---|---|---|---|
| 4,707,384 | 11/1987 | Schachner et al. | 428/408 |
| 4,988,421 | 1/1991 | Drawl et al. | 204/192.3 |
| 5,114,696 | 5/1992 | Purdes . | |
| 5,139,372 | 8/1992 | Tanabe et al. | 407/119 |
| 5,173,089 | 12/1992 | Tanabe et al. . | |
| 5,225,275 | 7/1993 | Aida | 428/408 |
| 5,271,971 | 12/1993 | Herb et al. . | |
| 5,366,522 | 11/1994 | Nakamura et al. | 51/309 |
| 5,432,003 | 7/1995 | Plano et al. . | |
| 5,491,028 | 2/1996 | Sarin et al. | 428/408 |
| 5,496,596 | 3/1996 | Herb et al. . | |
| 5,500,248 | 3/1996 | Iacovangelo et al. | 51/309 |
| 5,516,027 | 5/1996 | Tanabe et al. | 228/44.7 |
| 5,584,045 | 12/1996 | Tanabe et al. | 51/307 |

FOREIGN PATENT DOCUMENTS

| | | |
|---|---|---|
| 4-240189 | 8/1992 | Japan . |
| 6-116088 | 4/1994 | Japan . |
| 6-172087 | 6/1994 | Japan . |
| 8-104597 | 4/1996 | Japan . |

OTHER PUBLICATIONS

Shi et al., "Growth of a Well–Adhering Diamond Coating on Sintered Tungsten" Diamond and Related Materials 4 (1995) pp. 1079–1087.
Japan New Diamond Forum, 1989.1, vol. 5, No. 15 (1989).

Primary Examiner—A. A. Turner
Attorney, Agent, or Firm—Armstrong, Westerman, Hattori, McLeland & Naughton

[57] ABSTRACT

A diamond coated article is disclosed which consists essentially of a substrate and a plurality of polycrystalline diamond film layers accumulatively coated thereon in a total thickness of at least 20 $\mu$m, wherein each of the polycrystalline diamond film layers (i) has a thickness of 6 to 13 $\mu$m, (ii) has an average crystallite size in the surface direction thereof of 3 to 7 $\mu$m, (iii) has (111) oriented diamond crystallites exposed on the surface thereof, and (iv) satisfies the relationship: I(N)I(D)<0.2, wherein I(D) represents an intensity of diamond Raman peak in counts/sec appearing around 1333 cm$^{-1}$ and I(N) represents a maximum intensity among non-diamond Raman peaks appearing between 1200 cm$^{-1}$ and 1600 cm$^{-1}$.

2 Claims, 3 Drawing Sheets

DIAMOND COATED ARTICLE AND PROCESS FOR PRODUCING THEREOF

FIELD OF THE INVENTION

The present invention relates to an article, particularly a cutting tool, having a plurality of synthetic diamond film layers coated on the surface thereof. More specifically, the present invention relates to an article, e.g., cutting tool, having a plurality of polycrystalline diamond film layers coated on the surface thereof by CVD (chemical vapor deposition), the surface of said plurality of polycrystalline diamond film layers being smoothened and the mechanical strength and abrasion resistance (or wear resistance) of said plurality of diamond film layers being enhanced, and a process for the production thereof.

BACKGROUND OF THE INVENTION

A classical method for the formation of a synthetic diamond material comprises the conversion of carbon material into a single crystal diamond body at a high temperature and a high pressure. Such a single crystal body can be smoothened on the surface thereof to an extreme extent. Further, such a single crystal diamond has an enhanced mechanical strength and abrasion resistance, However, this method can hardly accomplish the direct film formation of diamond on the surface of the article. Further, this method cannot cover a large area of the surface of the article by the diamond film.

A method for directly forming a diamond film in a large area on the surface of the article by a CVD (chemical vaper deposition) was developed in the 1980's. Since then, this method has been under improvement. In this method, a hydrogen gas and a gas containing carbon are mixed. The mixed gas is then rendered plasma state. This plasma is then brought into contact with the surface of the article to cause the deposition (i.e., nucleus formation) of a large number of diamond seed crystals, i.e., crystal nuclei on the surface of the article. Subsequently, these crystal nuclei are allowed to grow to form a polycrystalline diamond film layer (hereinafter sometimes referred to as "film") coated on the surface of the article. This method is called "CVD (chemical vapor deposition). The diamond film coated on the surface of the article by this CVD method comprises polycrystallites because it is a product of a formation process which comprises the formation of a large number of diamond crystal nuclei which are each then allowed to grow so that the surface of the article is continuously covered by diamond crystallites.

The diamond crystallites which have covered the surface of the article then each grow perpendicular to the surface of the article. A report (*NEW DIAMOND*, Vol. 5, No. 15 (1989), Japan) says that when the diamond crystallites are allowed to grow continuously to orient columnar crystals with (100) plane, one of crystal planes thereof nearly in parallel with the surface of the film, only the (100) planes are exposed from the surface of the resulting diamond film, making it possible to obtain a high quality diamond film having an excellent surface smoothness and little non-diamond components therein. In general, however, some diamond crystallites made by the CVD method continue to increase their crystal sizes while growing perpendicular to the film. But, other diamond crystallites made by the CVD method stop their growth in the course of process to yield the expansion of crystal sizes to other diamond crystallites. The diamond film thus coated is generally observed comprising (111) planes and the other planes such as (110) and (100) exposed at the surface thereof in admixture. The diamond film coated by CVD method is made of an aggregate of diamond crystallites and has the following disadvantages. When the thickness of the diamond film increases, the number of diamond crystallites on the surface of the film decreases and the size of diamond crystallites on the surface of the film increases, resulting in raising the surface roughness of the diamond film, though providing the diamond film with a high surface hardness. As mentioned above, when the diamond crystallites are allowed to grow in a uniform the crystalline orientation, i.e., (100) crystal planes thereof being oriented in parallel with the surface of the film, the surface roughness as well as the crystalline size can be controlled. However, since the (100) plane of the diamond has a smaller diamond hardness than other planes such as (111) plane, the article having diamond film layer(s) coated on the surface thereof in such an arrangement that only the (100) planes are exposed to the exterior does not derive the best hardness from the diamond in the application such as cutting tool requiring a high abrasion resistance. Thus, the article having the diamond film coated in such an orientation that only the (100) planes are exposed to the exterior is unsuitable for the use in working requiring abrasion resistance. The hardness of a diamond on (100) crystal plane and (111) crystal plane are about 5,700 $kg/mm^2$ and 9000 $kg/mm^2$, respectively, by Knoops scale under a load of 500 g. The hardness on (110) crystal plane is intermediate between these values, It is desirable that the article requiring a high abrasion resistance, such as cutting tool, has a diamond film formed on the surface thereof in such an orientation that the (111) planes, which show the greatest hardness among the planes of diamond crystals, are exposed to the exterior as many as possible.

When the diamond film formed by the CVD method is analyzed by Raman spectropy, non-diamond components such as pyrolitic graphite and amorphous carbon are detected besides diamond. When the content of non-diamond components in the diamond film increases, the diamond film softens as a matter of course and hence shows a drop in wear resistance or abrasion resistance or hardness regardless of plane orientation and deteriorates in thermal conductivity or chemical stability.

In the case of an article requiring a high abrasion resistance, particularly a cutting tool, the desired thickness of the diamond film to be coated thereon is at least 20 $\mu$m preferably from 30 to 100 $\mu$m. In the case of an abrasion resistant article requiring a prolonged life, the thickness of the diamond film to be coated thereon is occasionally about not less than 1 mm. An article for such a use, particularly a cutting tool, is brought into contact with a work to be out when used. Thus, the blade of such a cutting tool needs to be smooth. Otherwise, the surface of the work is scratched more than necessary during cutting. This requirement is common to almost all abrasion resistant articles.

When the polycrystalline diamond film is continuously formed to a thickness of not less than 20 $\mu$m on the edge surface of such a cutting tool or other articles requiring a high abrasion resistance by the foregoing CVD method in such an arrangement that the (111) planes are exposed to the exterior by at least 50%, a crystal size of each diamond crystallite measured at the surface of the film grows to not less than 10 $\mu$m, about half the thickness of the film. There is a clear correlation between the surface roughness of the worked surface of the work and the mean crystal size of the crystallites forming the edge of the cutting tool if the edge which comes into contact with the work to be cut is not smoothly whetted in advance. For example, when the edge with a 20 μm-thick polycrystalline diamond film which comprises diamond crystallites having a mean particle size of about 10 μm at the surface cuts a work, it will leave the work with a surface roughness (Ry) of about 10 to 15 μm. On the other hand, the edge with a 40 μm-thick polycrystalline diamond film which comprises diamond crystallites having a particle size of about 20 μm cuts the work leaving the surface roughness (Ry) as high as about 15 to 25 μm. Accordingly, in order to minimize the surface roughness of the work after working, it has heretofore been necessary that the tool edge having a single crystalline diamond layer thereon with the thickness as high as not less than 20 μm, for example, be smoothened on the surface of the edge by grinding or whetting, This results in a high production cost that gives a trouble.

In the case of such an article requiring a high abrasion resistance, particularly a cutting tool, the foregoing abrasion resistance of the diamond film coated on the edge is important. At the same timer commonly speaking, the diamond coated film must not be damaged by severe cutting load. Otherwise, the damaged cutting edge not only scratches the work to be cut but also disables cutting.

Accordingly an abrasion resistant article having a polycrystalline diamond film coated thereon by the CVD method must satisfy three requirements at the same time. In other words, such an abrasion resistant article must have a smooth diamond film, that is, its diamond crystallites must have a minimized mean crystal size. The diamond film must maintain its hardness high. Finally, the diamond film is insusceptible to damage such as crack. In these respects, the abrasion resistant article having the polycrystalline diamond film coated thereon by the CVD method leaves much to be improved. The present invention provides improvements in these requirements.

As the related art techniques for the formation of a plurality of polycrystalline diamond film layers on the surface of an article, there are provided U.S. Pat. Nos. 5,114,696 and 5,432,003, JP-A-8-104597 (The term "JP-A" as used herein means an "unexamined published Japanese patent application"), and JP-A-6-172087 so far as the present inventors know.

U.S. Pat. No. 5,114,696 and JP-A-8-104597 disclose a method which comprises alternate lamination of two or more layers of (i) diamond-like material or diamond-like carbon and (ii) diamond on the surface of an article. In the plurality of diamond film layers formed by these methods, the diamond-like carbon (DLC) layer which is not diamond is present interposed between these diamond layers. Accordingly, if an abrasion resistant article, e.g., cutting tool is coated with the diamond film layers formed by these methods, there is a disadvantage in that it shows a change in abrasion resistance during the operation when the abrasion of the diamond film layer proceeds to the diamond-like layer which is not diamond, deteriorating the quality of the worked surface of the work.

Further, U.S. Pat. No. 5,432,003 discloses a multilayer film made of a first layer of microcrystalline diamond and a second layer of polycrystalline diamond having a greater thickness than the first layer. However, the multilayer film having a total thickness of about not more than 2 μm in only disclosed. Accordingly, this disclosure gives no suggestions for solving the problems of the conventional abrasion resistant article, e.g., cutting tool having a diamond film layer coated on the surface thereof to a thickness of at least about 20 μm.

JP-A-6-172087 discloses a technique which may be closest to the present invention. JP-A-6-172087 describes an article having a plurality of diamond film layers formed thereon by the CVD method and a process for production thereof. This article is a product of lamination of a plurality of layers each synthesized under different conditions. That is, even when the outermost diamond film layer is cracked, the crack stops at the other adjacent layer having a different kind of diamond layer interposed as an interface layer, making it possible to inhibit the expansion of such a crack damage. JP-A-6-172780 discloses a process for the production of the diamond coated article wherein a difference in diamond-synthesis conditions is made by varying a material gas ratio (ratio of hydrogen gas to carbon-containing gas), a pressure of the gas and/or a microwave power for forming plasma. However, unlike the present invention, the concept of which comprises an object of inhibiting the damage of the diamond coated film itself, JP-A-6-172087 discloses only a limited technical concept of forming an interface layer for stopping a further development of the crack. The disclosure of JP-A-6-172087 does not refer to an optimum diamond multilayer which takes into account all requirements such as surface roughness of the diamond layer, anti-damage properties and abrasion resistance, i.e., life against abrasion, which an abrasion resistant article, particularly cutting tool, should have. In some detail, JP-A-6-172087 discloses only one example of drastically different synthesis conditions (Condition A and Condition B) for two different diamond layers, each adjacent layer formed as shown below:

Synthesis condition A:
  Gas pressure: 10 torr
  Material gas: CO 80 cc/min+$H_2$ 20 cc/min
  Microwave powers: 1.5 kw
  Substrate temperature: approx. 700° C.
  Synthesis time: approx. 10 hr/badge
Synthesis condition B:
  Gas pressure: 0.1 torr
  Material gas: CO 20 cc/min+$H_2$ 80 cc/min
  Microwave powers: 4 kw
  Substrate temperature: approx. 700° C.
  Synthesis time: approx. 10 hr/badge U.S. Pat. No. 5,173,089 discloses the CVD method for producing a polycrystalline diamond tool, wherein molar ratio (B1/A1) of molar density (B1) of a carbon-containing gas to molar density (A1) of hydrogen gas in the material gas in the first depositing step in which the diamond is deposited to a certain thickness more than 12 μm is smaller than molar ratio (B2/A2) of molar density (B2) of the carbon-containing gas to molar density (A2) of hydrogen gas in the material gas in the depositing step (i.e., (B1)/(A)<(B2)/(A2)). However, the object of the above patent is to provide a single layer of a polycrystalline diamond, having a thickness of more than 40 μm on a tool and to produce a cutting tool by brazing the single diamond layer on a substrate. The resultant diamond crystallites in the single layer will have a mean crystal size of more 20 μm. Thus, this method does not disclose a multilayered diamond tool, but a single diamond layer on the tool. Further, this method uses $N_2$ in the starting material gas.

SUMMARY OF THE INVENTION

An object of the present invention is to (1) raise the surface smoothness of the diamond film layer, (2) maintain the abrasion resistance of the diamond film layer itself high and (3) enhance the damage resistance of the diamond film layer, in an article having a diamond multilayer (a plurality of polycrystalline diamond film layers) coated on the surface thereof by a CVD method, particularly a cutting tool having a plurality of such diamond film layers coated at least on its edge.

Another object of the present invention is to (4) provide an abrasion resistant article having a prolonged life while maintaining the above effects even if it has a diamond film layer formed thereon to a thickness of not less than 20 μm. Precisely speaking, an object of the present invention is to provide an article which can accomplish the foregoing four effects at the same time.

A further object of the present invention is to disclose an optimum process for the production of an abrasion resistant article which can accomplish the foregoing effects at the same time.

The article of the present invention, which has a plurality of diamond film layers accumulatively coated on the surface of a substrate, has the following characteristics: (1) The average diamond crystallite size (or rather mean diamond crystal size) measured at the surface of the diamond film layer is from 3 to 7 μm; (2) (111) planes of diamond crystallites are exposed at (or rather from) the surface of the outmost diamond film layer; (3) The total thickness of the diamond film layers is not less than 20 μm; and (4) The diamond film layers satisfy the relationships I(N)/I(D)<0.2, preferably 0.05<I(N)/I(D)<0.15, wherein I(D) represents an intensity of diamond Raman peak in counts/sec appearing around 1333 cm$^{-1}$ and I(N) represents a maximum intensity among non-diamond Raman peaks in counts/sec appearing between 1200 cm$^{-1}$ and 1600 cm$^{-1}$, as determined by Raman spectrum intensity analysis (Raman spectroscopy), The article of the present invention is summarized as follows.

A coated article consisting essentially of a substrate and a plurality of polycrystalline diamond film layers accumulatively coated thereon in a total thickness of at least 20 μm:

said each polycrystalline diamond film layers (i) having a thickness of 6 to 13 μm, (ii) having an average crystallite size of 3 to 7 μm measured in the surface direction of the film, (iii) having (111) crystal planes of diamond crystallites exposed at the surface of the film, and (iv) having a ratio of any one of intensities of non-diamond Raman peaks in counts/sec appearing between around 1200 cm$^{-1}$ and around 1600 cm$^{-1}$ to a maximum intensity of diamond Raman peak in counts/sec appearing around 1333$^{-1}$, of smaller than 0.2.

The present invention also discloses a method for producing the above article. The method for preparing the article of the present invention is summarized as follows.

A method for making a coated article consisting essentially of a substrate and a plurality of polycrystalline diamond film layers accumulatively coated thereon in a total thickness of at least 20 μm, said each polycrystalline diamond film layers (i) having a thickness of 6 to 13 μm, (ii) having an average crystallite size in the direction of the film of 3 to 7 μm, (iii) having (111) diamond crystallites exposed at the surface of the film, and (iv) having a ratio of any one of intensities of non-diamond Raman peaks in counts/sec appearing between around 1200 cm$^{-1}$ and 1600 cm$^{-1}$ to a maximum intensity of diamond Raman peak in counts/sec appearing around 1333 $^{-1}$, of smaller than 0.2, which comprises the steps of:

(A) pretreating said substrate for nucleation enhancement;
(B) placing said substrate in a CVD reactor suitable for diamond deposition;
(C) depositing diamond on said substrate until a thickness of diamond film becomes 1 to 3 μm, by providing an atmosphere consisting essentially of hydrogen gas and carbon-containing gas, providing microwave power to form a plasma in the region of said substrate and maintain said substrate at a temperature of between about 800° C. to about 900° C. (herein after sometimes referred to as "film formation step": the stop for forming polycrystalline film from nuclei);

(D) elevating the temperature of said substrate by 50° to 100° C. and/or increasing a content of the carbon-containing gas in the atmosphere by 5 to 15% by volume, and subsequently further growing said deposited diamond film until its thickness becomes 6 to 13 μm in total, to thereby form a polycrystalline diamond layer on said substrate (hereinafter sometimes referred to as "growth step": the step for increasing the polycrystalline film thickness);

(E) lowering the temperature of said substrate by at least 50° C. and/or decreasing the content of the carbon-containing gas in the atmosphere by at least 5% by volume, thereby to stop growing the diamond film on said substrate;

(F) newly depositing diamond on said polycrystalline diamond layer in the CVD reactor until a thickness of newly deposited diamond film becomes 1 to 3 μm, by providing substantially the same,atmosphere and microwave power as in the step (C) and maintaining said substrate at substantially the same temperature as in the step (C) (i.e., film formation step);

(G) elevating-the temperature of the substrate by 50° to 100° C. and/or increasing the content of the carbon-containing gas in the atmosphere by 5 to 15% by volume in comparison with conditions of the step (C)t and subsequently further growing said newly deposited diamond film until its thickness becomes 6 to 13 μm, thereby to accumulate another polycrystalline diamond layer on said polycrystalline diamond layer (i.e., growth step); and (H) optionally repeating the steps (E), (F) and (G) in turn so that a total thickness of the polycrystalline diamond layers accumulated on said substrate becomes more than 20 μm.

DESCRIPTION OF PREFERRED EMBODIMENTS

Figure 1A:
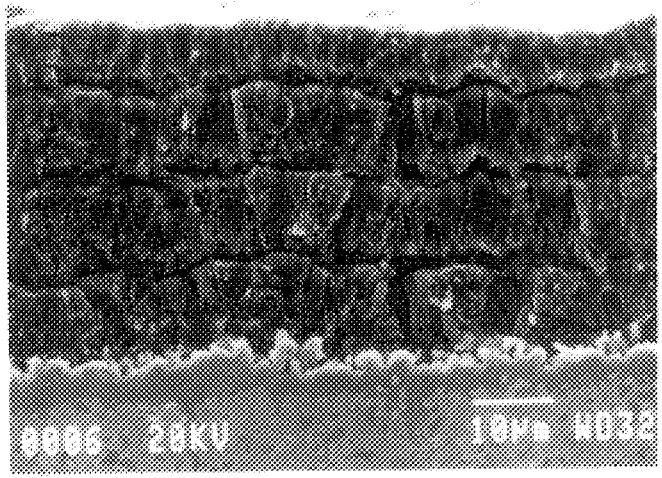
FIG. 1(A) is a photograph of a section of a diamond-coated article of the present invention which has been etched, taken by a scanning electron microscope.

The present invention has been worked out on the basis of technical knowledge that crystallites which have thoroughly grown, i.e., crystallites which have grown until the end of the growth step of the diamond polycrystalline layer, can easily stop its further growth when the temperature is lowered or the content of the carbon-containing gas is reduced and that the deposition and growth of new diamond nuclei on said diamond layer can be initiated at a temperature relatively lower than that of the foregoing growth step or with a content of carbon-containing gas in the material gas mixture relatively lowered compared to that of the foregoing growth step. One of the elements of the method of the present invention derives from these knowledge and utilization thereof: a plurality of times to form diamond film layers on the surface of the article to optimize the abrasion resistance and the surface smoothness.

In this process, at the film formation step, the entire surface of the substrate on which a diamond film is to be formed is covered by nuclei. The CVD synthesis may be preferably accomplished with microwave plasma method in view of stability. As source a gas for supplying carbon in the synthesis, carbon monoxide gas is preferred. As a source gas for supplying carbon in the synthesis, carbon monoxide is preferred. Although the CVD synthesis method anyway comprises the excitation of a mixture of source gas and hydrogen gas to effect reaction, it is preferably effected under the condition that the reaction temperature at the growth step should be kept about the same as or somewhat higher than that at the film formation step. Similarly, the CVD synthesis method is preferably effected under the condition that the concentration of carbon monoxide in the material gas at the film growth step should be higher that at the film formation step.

In some detail, at the nucleation step, a mixture of from 90 to 98% by volume (preferably from 94 to 97% by volume) of hydrogen and from 2 to 10% by volume (preferably from 3 to 6% by weight) of carbon monoxide is preferably used. The synthesis temperature is preferably from 800° C. to 900° C., This is because a high diamond nucleation density may not be provided to the extent that the abrasion article needs in strength if the concentration of carbon monoxide and the synthesis temperature deviate from the above defined range.

In the process for the production of an abrasion resistant article according to the present invention, the step of allowing diamond nuclei to grow to a polycrystalline film is repeated a plurality of times. However, the thickness of the film thus formed should be limited to 1 to 3 $\mu$m per one repetition. The film thus obtained should not be thicker than necessary so far as it is a dense continuous layer. The abrasion resistant article according to the present invention can be produced by repeating a cycle of process for the formation of a single diamond film layer comprising a step of forming a continuous layer, a step of allowing the continuous layer to grow and a step of completing the growth step a plurality of times to accumulatively form a plurality of diamond film layers in number corresponding to the number of cycles repeated. The present invention proposes one optimum synthesis condition in the procedure.

The continuous polycrystalline film having a thickness of from 1 to 3 $\mu$m is also required herein to allow the crystallites in the film to grow stably and uniformly at the subsequent growth step (i.e., step of increasing the thickness of the continuous polycrystalline film by 5 to 10 $\mu$m to give a thickness of from 6 to 13 $\mu$m per layer). However, since the film at this step tends to show a relatively high Raman peak ratio as described later, the thickness of the film at the film formation step should be limited to 3 $\mu$m at maximum to find application to abrasion resistant tools requiring high abrasion resistance and/or durability, e.g., cutting tool. Further, Raman peak ratio at this step needs to be not more than 0.2, preferably not more than 0.15, as estimated from the specimen of the present invention.

Figure 3:
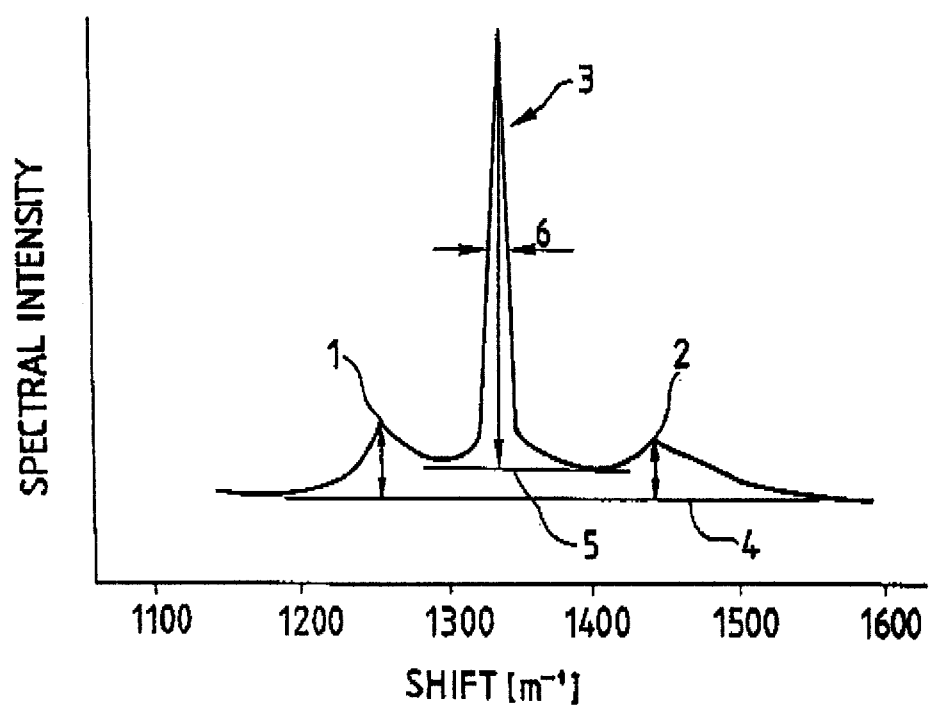
FIG. 3 is a graph illustrating the definition on which the content of components in the diamond film layer are compared by Raman spectroscopy.

FIG. 3 illustrates the definition of spectral intensity in Raman spectroscopy according to the present Invention. The definition of spectral Intensity according to the present invention is essentially the same as known definition. In some detail, base lines are drawn each for diamond component and non-diamond component(s). The intensity value at these base lines are subtracted from diamond Raman peak value and non-diamond Raman peak value(s), respectively, to determine the respective relative intensities. The term "Raman peak ratio of diamond film layer" as used herein is meant to indicate the value obtained by dividing a Raman spectral maximum intensity of non-diamond component(s) in the film layer by that of diamond in the film layer.

A raman peak ratio of the upper part of the various polycrystalline diamond coated film layers (i.e., diamond crystallites at their growth step) is defined to not more than about 0.1 herein. In the present invention, the difference in Raman peak ratio between the step of allowing nuclei to grow to a continuous polycrystalline film and the step of allowing the polycrystalline film to grow in thickness is from 0.02 to 0.11 which may be computed from Table 1. This difference is preferably from about 0.03 to 0.09 particularly because a cutting tool, for example, can have a prolonged life while maintaining the desired surface smoothness of its edge when the diamond film layer has a thickness falling within the range defined herein. The term "prolonged life" as used herein is meant to indicate that the article satisfies both abrasion resistance and damage resistance.

In order to attain the objects of the present invention, the FWHM (full width at half maximum) of the uppermost surface of the diamond coated film layer may be about from 4 to 15 cm$^{-1}$, preferably about from 5 to 8 cm$^{-1}$.

At the growth step, a mixture of from 80 to 93% by volume (more preferably from 82 to 90% by volume) of hydrogen and from 7 to 20% by volume (more preferably from 10 to 18% by volume) of carbon monoxide is preferably used. The synthesis temperature is preferably from 850° C. to 950° C. This is because a diamond having a high crystallinity and an excellent abrasion resistance may hardly be provided if the concentration of carbon monoxide and the synthesis temperature deviate from the above defined range.

At the growth step, the film thickness is preferably increased until it becomes from 6 to 13 $\mu$m (added thickness: from 5 to 10 $\mu$m). If the thickness of the film formed at the growth step falls below the above defined range, the uniformity of (111) planes having a high abrasion resistance formed at the growth step falls into disorder, making it render impossible to expect the enhancement of abrasion resistance. On the contrary, if the thickness of the film layer grown at the growth step exceeds the above defined range, the diamond crystallites (crystals) grow excessively, providing coarse undesired diamond crystals exposing from the outermost surface of the coated film.

As the substrate there may be used a material which can withstand the CVD synthesis of a diamond film, such as ceramics including cemented carbide, cermet, or silicon nitride. The substrate to be used herein preferably has a roughness on its surface to have an enhanced adhesion to the synthesized diamond film.

The present invention will be further described in the following examples, but the present invention should not be construed as being limited thereto.

EXAMPLE 1

WC, TiC, TaC and Co powders were mixed and pressed into a compact body which was then sintered to prepare a cemented carbide sintered product having a composition WC-5%(Ti,Ta)C-5%Co. The sintered product was shaped into a tool substrate of SPGN120308 according to ISO specification.

The sintered product was then kept in a gaseous mixture of 1% of $N_2$ and the balance of Ar at a temperature of 1,375°

C. under 1 atmosphere for 3 hours to obtain the surface of the tool substrate, having numberless irregularities with an average aperture diameter about of from 0.5 to 5 μm, an average aperture depth of about from 0.5 to 10 μm and an average aperture interval of about from 2 to 4 μm continuously formed on the surface thereof with protrusions. The substrate thus treated was dipped in a solvent having finely divided diamond particles having an average size of 10 μm dispersed therein where it was then subjected to ultrasonic treatment at a frequency of 40 KHz for 30 minutes to erode the surface of the substrate with the diamond particles in order to pretreat or activate the surface thereof for diamond-nucleation enhancement.

Subsequently, the substrate was placed in a 2.45 GHz microwave plasma CVD apparatus to form a diamond film on the tool substrate at a total pressure of 40 torr, while the microwave power was so properly controlled by varying from 200 to 1,000 W that the substrate exhibited a temperature shown in Table 1. The substrate was subjected to cycles of the diamond film formation step and the film growth step under the CVD conditions set forth in Table 1, to prepare cutting tool tips (Sample Nos. 1 to 21) with diamond film layers having a total layer thickness of about from 20 to 40 μm.

The maximum intensity of diamond Raman peak: I(D) and the maximum intensity among non-diamond Raman peak(s): I(N) were measured after the film formation step and the growth, step at the final cycle, to obtain the Raman peak intensity ratio: I(N)/I(D), The object of this Raman spectral analysis is to measure the non-diamond component (s) and the diamond component in the diamond film layer. As can be seen in FIG. 3, when a peak of spectral intensity appears in the vicinity of 1,333 $cm^{-1}$ in Raman shift, it indicates the presence of diamond. In FIG. 3, numerals 1 and 2 each indicates a Raman peak of a non-diamond component; numeral 3 indicates a Raman peak of a diamond component; numeral 4 indicates a base line of non-diamond components; numeral 5 indicates a base line of a diamond component; and numeral 6 indicates a FWHM. The peak at 1333 $cm^{-1}$ is called a diamond Raman peak. If any peaks of spectral intensity appear apart from the shift position (1333 $cm^{-1}$) where the diamond Raman peak appears, it is indicated that components other than diamond, i.e., non-diamond components such as graphite and amorphous carbon are present in the diamond film layer. The shaper position and intensity (height) of Raman peak provides data of diamond crystallites present in the specimen such as size, defect density and stress. Further, the comparison of the heights of peaks of Raman spectral intensity makes it possible to compare the quality of diamond crystallites in the diamond layer.

Raman spectral analysis on the diamond film layer in the examples was effected at the following shift positions. As the height of Raman peak of non-diamond there was selected that of the highest peak appearing between about 1,200 $cm^{-1}$ and 1,600 $cm^{-1}$. As the diamond Raman peak there was selected one appearing in the vicinity of 1,333 $cm^{-1}$ as a matter of course. Further, in order to judge the quality of crystallinity of the diamond film layer, the outermost surface of the diamond film layer was measured for FWHM (full width at half maximum intensity) by the Raman spectroscopy.

In the present embodiment, X-ray diffractometry was applied in defining that the (111) crystal planes of diamond crystallites were exposed at the polycrystalline diamond layer coated on the substrate. Specifically, if the measured ratio of X-ray diffraction peak intensity on the (111) plane to that of the other plane(s) was higher than the corresponding ratio listed in the Card No. 6-0675 of JPPS (Joint Committee on Power Diffraction Standards), the crystallites of said layer were determined as exposed their (111) planes.

According to the above mentioned definition, (111) planes were exposed at the exterior more than (100) and (110) planes in all case the diamond layers (Sample Nos. 1 to 12).

These cutting tips were each observed using a scanning electron microscope to determine the surface crystal size of the diamond crystallites exposed on the outermost surface of the layer. The cutting tool tip corresponding to Sample No. 11 was cut in the direction perpendicular to the rake surface thereof. After mirror-polishing the section, the specimen was placed in a CVD chamber. Only hydrogen gas was then charged into the CVD chamber. A microwave power of 200 to 300 W with a frequency of 2.45 GHz was then supplied into the chamber for about 20 minutes so that the specimen was plasma-etched. The section of the specimen was then photographed using a scanning electron microscope as shown in FIG. 1 (A). As can be seen in this photographs a definite interface is present between diamond film layers each having a thickness of about 10 μm. It can also be seen in this photograph that a layer is formed continuously perpendicular to the interface, all the way from forming the nucleus to the step of allowing the crystal to grow.

The cutting tips with a diamond film prepared under the conditions set forth in Table 1 and a cutting tip having the same shape made of a sintered diamond as a reference sample were then subjected to continuous cutting test under the conditions shown below. Thus, the surface roughness Ry of the work was measured at the initial stage of cutting (cutting length: not more than 300 m) and when the cutting length reached 20,000 m. In the case of the cutting tip made of a sintered diamond, the surface roughness Ry was 2 μm at the initial stage of cutting and 3 μm when the cutting length reached 20,000 m. Further, for evaluating the durability, the cutting tests of the cutting tips prepared under the conditions set forth in Table 1 (Sample Nos. 1 to 21) were continued until the substrates were exposed to exterior so as to find the cutting distances.

Work material to be cut: Al-12 wt % Si alloy

Cutting speed: 800 m/min,

Feed: 0.1 mm/rev

Depth of cut: 0.25 mm

TABLE 1

| Sample No. | Film formation step | | | | | film growth step | | | | | Remarks |
|---|---|---|---|---|---|---|---|---|---|---|---|
| | Gas flow (cc/min) | | Temperature (°C.) | Synthesis time (h) | Raman peak Ratio | Gas flow (cc/min) | | Temperature (°C.) | Synthesis time (h) | Raman peak ratio | |
| | $H_2$ | CO | | | | $H_2$ | CO | | | | |
| 1 | 97 | 3 | 800 | 5 | 0.13 | 85 | 15 | 900 | 3 | 0.08 | |
| 2 | 95 | 5 | 800 | 4 | 0.15 | 90 | 10 | 900 | 4 | 0.06 | |
| 3 | 95 | 5 | 800 | 4 | 0.15 | 85 | 15 | 850 | 3.5 | 0.08 | |
| 4 | 95 | 5 | 800 | 4 | 0.15 | 85 | 15 | 900 | 3 | 0.08 | |

TABLE 1-continued

| Sample No. | | | | | | | | | | | Remarks |
|---|---|---|---|---|---|---|---|---|---|---|---|
| 5 | 95 | 5 | 900 | 3 | 0.13 | 90 | 10 | 900 | 4 | 0.06 | |
| 6 | 95 | 5 | 900 | 3 | 0.13 | 90 | 10 | 950 | 3 | 0.07 | |
| 7 | 95 | 5 | 900 | 3 | 0.13 | 85 | 15 | 900 | 3 | 0.08 | |
| 8 | 95 | 5 | 900 | 3 | 0.13 | 80 | 20 | 900 | 2.5 | 0.10 | |
| 9 | 92 | 8 | 900 | 2 | 0.11 | 85 | 15 | 900 | 3 | 0.08 | |
| 10 | 95 | 5 | 900 | 3 | 0.13 | 85 | 15 | 900 | 3 | 0.08 | |
| 11 | 95 | 5 | 900 | 3 | 0.13 | 85 | 15 | 900 | 3 | 0.08 | |
| 12 | 80 | 20 | 900 | 2 | 0.19 | 85 | 15 | 900 | 3 | 0.08 | * |
| 13 | 80 | 20 | 800 | 3 | 0.22 | 85 | 15 | 900 | 3 | 0.08 | * |
| 14 | 80 | 20 | 700 | 4 | 0.25 | 80 | 20 | 900 | 4 | 0.19 | * |
| 15 | 95 | 5 | 900 | 3 | 0.13 | 85 | 15 | 900 | 7 | 0.08 | * |
| 16 | 95 | 5 | 900 | 3 | 0.13 | 85 | 15 | 900 | 15 | 0.08 | * |
| 17 | 20 | 80 | 700 | 8 | 1.25 | 80 | 20 | 700 | 8 | 0.25 | * |
| 18 | 60 | 40 | 900 | 1 | 1.5 | 85 | 15 | 900 | 3 | 0.08 | * |
| 19 | 70 | 30 | 900 | 1 | 0.4 | 85 | 15 | 900 | 3 | 0.08 | * |
| 20 | 95 | 5 | 900 | 25 | 0.13 | | | | | | * |
| 21 | | | | | | 85 | 15 | 900 | 14 | 0.08 | * |

| Sample No. | Repeating number | Total layer thickness (μm) | Crystallite size (μm) | FWHM of Raman peak of uppermost diamond layer (cm⁻¹) | Working surface roughness (Rv) Initial (μm) | After 20,000 m cutting (μm) | Durability | Remarks |
|---|---|---|---|---|---|---|---|---|
| 1 | 2 | 20 | 5 | 8 | 3 | 4 | 50,000 | |
| 2 | 2 | 20 | 5 | 5 | 3 | 4 | 50,000 | |
| 3 | 2 | 20 | 5 | 8 | 3 | 4 | 50,000 | |
| 4 | 2 | 20 | 5 | 8 | 3 | 4 | 50,000 | |
| 5 | 2 | 20 | 5 | 5 | 3 | 4 | 50,000 | |
| 6 | 2 | 20 | 5 | 6 | 3 | 4 | 50,000 | |
| 7 | 2 | 20 | 5 | 8 | 3 | 4 | 50,000 | |
| 8 | 2 | 20 | 5 | 13 | 3 | 4 | 45,000 | |
| 9 | 2 | 20 | 5 | 8 | 3 | 4 | 50,000 | |
| 10 | 3 | 30 | 5 | 8 | 4 | 5 | 65,000 | |
| 11 | 4 | 40 | 5 | 8 | 5 | 6 | 80,000 | |
| 12 | 2 | 20 | 5 | 8 | 3 | 4 | 43,000 | * |
| 13 | 2 | 20 | 5 | 8 | 3 | 4 | 30,000 | * |
| 14 | 3 | 30 | 5 | 18 | 4 | 6 | 22,000 | * |
| 15 | 1 | 20 | 10 | 8 | 10 | 15 | 50,000 | * |
| 16 | 1 | 40 | 20 | 8 | 15 | 25 | 74,000 | * |
| 17 | 2 | 20 | 5 | 24 | 4 | — | 15,000 | * |
| 18 | 2 | 20 | 5 | 8 | 3 | — | 15,000 | * |
| 19 | 2 | 20 | 5 | 8 | 3 | — | 15,000 | * |
| 20 | 1 | 20 | 10 | 14 | 10 | 15 | 40,000 | * |
| 21 | 1 | 30 | 15 | — | — | — | peeled off after synthesis | * |

Note)
The symbol * in Table 1 indicates that the sample out of the scope of the present invention.

As shown in Table 1 the average surface crystal size of crystallites in the outermost layer of the film layers was about 5 μm as measured along the surface, with all Sample Nos. 1 to 12. The FWHM of Raman peak on the outermost layer was not more than 15 cm⁻¹. Accordingly, the particle size of the diamond crystallites in the outermost layer was almost kept constant regardless of the thickness of the diamond film layer. Further, a good crystallinity was obtained. Thus, fine diamond crystallites were obtained in the outermost layer.

On the contrary, Sample Nos. 13, 18 and 19, exhibiting the high Raman intensity ratio at the film formation stop and Sample Nos. 14 and 17, exhibiting the high Raman peak ratio at the film formation step and growth step exhibited a poor durability due to the high content of non-diamond components in the film. As can be seen in the fact that Sample No. 15 which had undergone only one cycle of film formation step and growth step, and Sample No. 16, which had similarly undergone only one cycle of film formation step and growth step but involving a prolonged synthesis process, exhibited a particle size of 10 μm and 20 μm, respectively. On the outermost layer, in connection with FIG. 2, the more the thickness of the film is, the greater is the surface crystal size. Further, Sample No, 20, which had undergone synthesis only under film formation step conditions showed a surface crystal size as great as 10 μm on the outermost layer. On the other hand, in the case of Sample No. 21, which had undergone synthesis only under growth step conditions, the film did not adhere to the substrate and thus peeled away after synthesis.

Figure 1B:
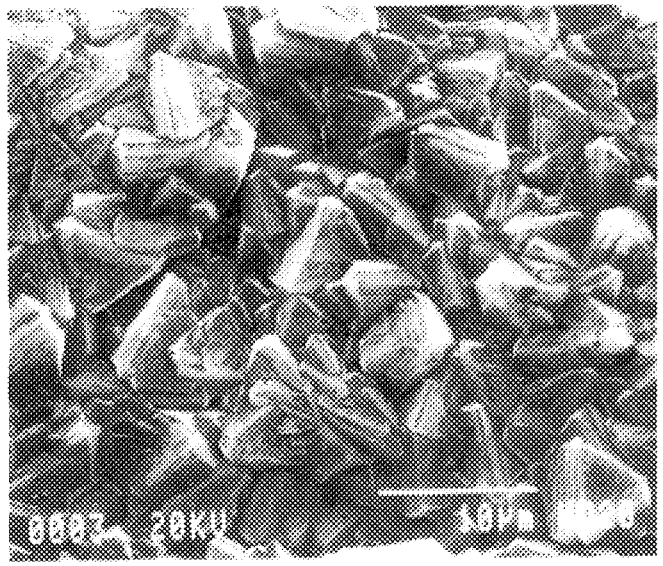
FIG. 1(B) is a photograph of a surface of a diamond coated film layer of a diamond coated article of the present invention, taken by a scanning electron microscope.
Figure 2:
FIG. 2 is a photograph of a surface of a single diamond layer having its thickness of 40 μm, taken by a scanning electron microscope.

FIG. 1(B) illustrates a polycrystalline photograph of the surface of a diamond film layer corresponding to Sample No. 11 of the present invention, taken using a scanning electron microscope. FIG. 2 illustrates a photograph of the surface of a diamond film layer corresponding to Sample No. 13, taken under the scanning electron microscope. The comparison of the two photographs gives a conclusion that Sample No. 11 has a smaller crystallite size than Sample No. 13 as judged by the size of crystallites exposed at the surface of the diamond film layer. Sample No. 11 has a better surface smoothness on the diamond film layer than Sample No. 13. Accordingly, it can be judged that the surface of Sample No. 11 is suitable for use in abrasion resistant articles, particularly cutting tool.

The diamond cutting tool produced under the conditions of the present invention could cut a work to a good surface smoothness (small surface roughness Ry) that stands comparison with sintered diamond at the initial stage of cutting and when the cutting length reached 20,000 m as shown in Table 1.

On the contrary, Sample nos. 15, 16, and 20, which had gained an increased crystal size at the outermost layer surface, cut a work leaving a surface roughness in proportion to the crystal size.

EXAMPLE 2

Diamond film-coated cutting tips were produced as Sample Nos. 22 to 26 under the same conditions as Sample Nos. 1 to 12 except some conditions set forth in Table 2. Among these specimens, Sample No. 22 underwent a shorter synthesis process in the second film formation step than Sample Nos. 1 to 12. Further, Sample No. 23 underwent synthesis in the second film formation stop at a higher temperature than the desired range of the present invention. Sample Nos. 24 to 26 underwent the second film formation step with a higher carbon monoxide concentration in the material gas than the desired range of the present invention.

Sample Nos. 22 to 26 were measured for surface crystal size of the outermost layer of the film layer in the same manner as the specimens set forth in Table 1. The results are set forth in Table 2.

microns allowing the abrasion resistant article to maintain its initial surface smoothness. This is because the surface toughness of the outmost layer exercises the marked effect on the surface roughness of the work with which the abrasion resistant article has come into contact and because diamond itself remains smooth polished by the work as can be seen in Table 1.

As mentioned above, in one of the aspects of the present invention, the substrate undergoes repetition of the cycle of nucleation step-growth step, In particular, the surface of a polycrystalline diamond film layer produced at the preceding step is entirely covered by newly developed diamond by changing the synthesis conditions during the next film formation, In this manner, finer diamond particles can be formed at the outermost polycrystalline diamond layer of the diamond multilayer coated on the substrate. Thus, an abrasion resistant diamond-coated article such as diamond film-coated cutting tool can be applied to a workpiece expecting a good surface finish of the workpiece after working.

It should further be apparent to those skilled in the art that various changes in for and detail of the invention as shown and described above may be made. It is intended that such changes be inclined with in the spirit and scope of the claimed appended hereto.

What is claimed is:

1. A diamond coated article consisting essentially of a substrate and a plurality of consecutive adjacent polycrystalline diamond film layers cumulatively coated on the

TABLE 2

| Sample No. | 1st film formation step | | | | | 1st growth step | | | | | 2nd film formation step | | | | | 2nd growth step | | | | | Total layer thickness ($\mu$m) | Crystallite size ($\mu$m) | Remarks |
|---|---|---|---|---|---|---|---|---|---|---|---|---|---|---|---|---|---|---|---|---|---|---|---|
| | Gas flow rate (cc/min) | | Temp. (°C.) | Time (hr) | | Gas flow rate (cc/min) | | Temp. (°C.) | Time (hr) | | Gas flow rate (cc/min) | | Temp. (°C.) | Time (hr) | | Gas flow rate (cc/min) | | Temp. (°C.) | Time (hr) | | | | |
| | $H_2$ | CO | | | | $H_2$ | CO | | | | $H_2$ | CO | | | | $H_2$ | CO | | | | | | |
| 22 | 95 | 5 | 900 | 3 | | 85 | 15 | 900 | 3 | | 95 | 5 | 900 | 1 | | 85 | 15 | 900 | 3 | | 20 | 10 | * |
| 23 | 95 | 5 | 900 | 3 | | 85 | 15 | 900 | 3 | | 95 | 5 | 950 | 2 | | 85 | 15 | 900 | 3 | | 20 | 10 | * |
| 24 | 95 | 5 | 900 | 3 | | 85 | 15 | 900 | 3 | | 85 | 15 | 800 | 3 | | 85 | 15 | 900 | 3 | | 20 | 10 | * |
| 25 | 95 | 5 | 900 | 3 | | 85 | 15 | 900 | 3 | | 70 | 30 | 900 | 1 | | 85 | 15 | 900 | 3 | | 20 | 10 | * |
| 26 | 95 | 5 | 900 | 3 | | 85 | 15 | 900 | 3 | | 50 | 50 | 900 | 0.5 | | 85 | 15 | 900 | 3 | | 20 | 10 | * |

Note)
The symbol * in Table 2 indicates that the sample out of the scope of the present invention.

As can be seen in Table 2, every sample showed an increased crystallite size at the outermost layer. This was probably because Sample No. 22 for example underwent a shorter synthesis in the second film formation process. If the process proceeds to the second growth step without enough diamond nuclei in the second film formation step, some crystallites formed at the first growth step continue to grow in the next step. This was confirmed by observing the film surface of the second film formation step.

While the various diamond layers are shown herein having almost the same thickness as the examples of the present invention, it may be necessary in some applications that the thickness of the uppermost film layer be smaller than that of the underlying layer to enhance the surface smoothness of the diamond film layer. For example, if the immediate lower film layer has a thickness of 12 microns, the uppermost film layer may have a thickness of 6 microns to control the average particle size of crystallites to about 3 substrate in a total thickness of at least 20 $\mu$m, each of said polycrystalline diamond film layers (i) having a thickness of 6 to 13 $\mu$m, (ii) having an average crystallite size in the surface direction thereof of 3 to 7 $\mu$m, (iii) having (111) oriented diamond crystallites exposed on the surface thereof, and (iv) satisfying the relationship: I(N)/I(D)<0.2, wherein I(D) represents the intensity of the diamond Raman peak appearing around 1333 cm$^{-1}$ and I(N) represents the maximum intensity among non-diamond Raman peaks appearing between 1200 cm$^{-1}$ and 1600 cm$^{-1}$.

2. The diamond coated article as claimed in claim 1, wherein said substrate is a cutting tool comprising a cutting edge, said cutting edge including a rake surface and a flank surface, and at least one of said rake surface and said blank surface is coated with said plurality of polycrystalline diamond film layers.

* * * * *